(12) United States Patent
Yun et al.

(10) Patent No.: US 8,907,319 B2
(45) Date of Patent: Dec. 9, 2014

(54) LIGHT EMITTING DEVICE PACKAGE

(71) Applicant: LG Innotek Co., Ltd., Seoul (KR)

(72) Inventors: Hyeong Seon Yun, Seoul (KR); Eun Dk Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/711,056

(22) Filed: Dec. 11, 2012

(65) Prior Publication Data

US 2013/0146841 A1 Jun. 13, 2013

(30) Foreign Application Priority Data

Dec. 12, 2011 (KR) .................. 10-2011-0132886
Nov. 30, 2012 (KR) .................. 10-2012-0137768

(51) Int. Cl.
*H01L 33/04* (2010.01)

(52) U.S. Cl.
USPC ........... 257/13; 257/98; 257/99; 257/E33.061

(58) Field of Classification Search
USPC ....................................... 257/13–15, 79–80
See application file for complete search history.

(56) References Cited

U.S. PATENT DOCUMENTS

| | | | |
|---|---|---|---|
| 2008/0316741 A1* | 12/2008 | Lee ............................... | 362/231 |
| 2009/0315012 A1* | 12/2009 | Dwilinski et al. .............. | 257/13 |
| 2010/0163905 A1* | 7/2010 | Kim ............................... | 257/98 |
| 2011/0108868 A1* | 5/2011 | Son ............................... | 257/98 |
| 2011/0309391 A1* | 12/2011 | Cho et al. ....................... | 257/98 |
| 2012/0235201 A1* | 9/2012 | Shum ............................. | 257/98 |
| 2013/0105848 A1* | 5/2013 | Cho ............................... | 257/98 |

* cited by examiner

*Primary Examiner* — Thanh Nguyen
(74) *Attorney, Agent, or Firm* — Birch, Stewart, Kolasch & Birch, LLP

(57) ABSTRACT

A light emitting device package includes a body having a cavity, at least one insulating layer disposed on the body, first and second electrode layers disposed on the insulating layer and electrically isolated from each other, at least one light emitting device disposed on a bottom surface of the cavity and electrically connected to the first and second electrode layer, a light-transmissive resin layer sealing the light emitting device disposed in the cavity, and a metal layer disposed on a rear surface of the body to face the light emitting device, wherein the light emitting device is grown in an m-direction on the (1123) plane of a substrate and includes a light emitting structure including a first conductive semiconductor layer, and active layer, and a second conductive semiconductor layer.

19 Claims, 16 Drawing Sheets

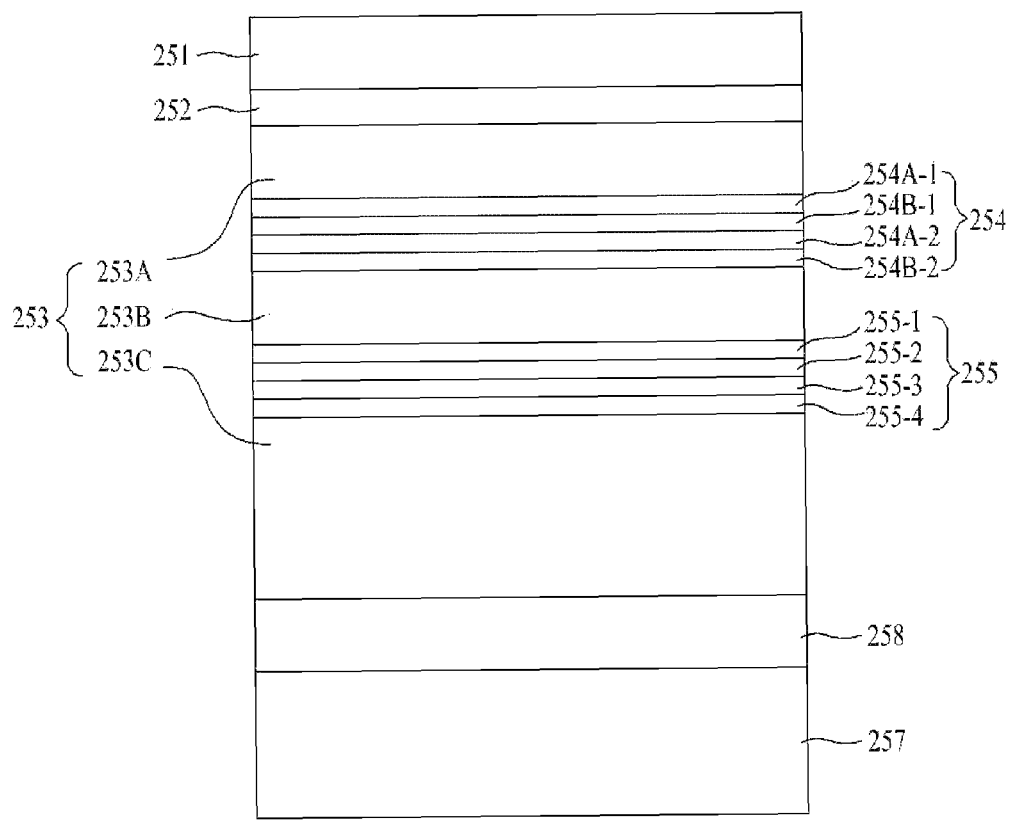

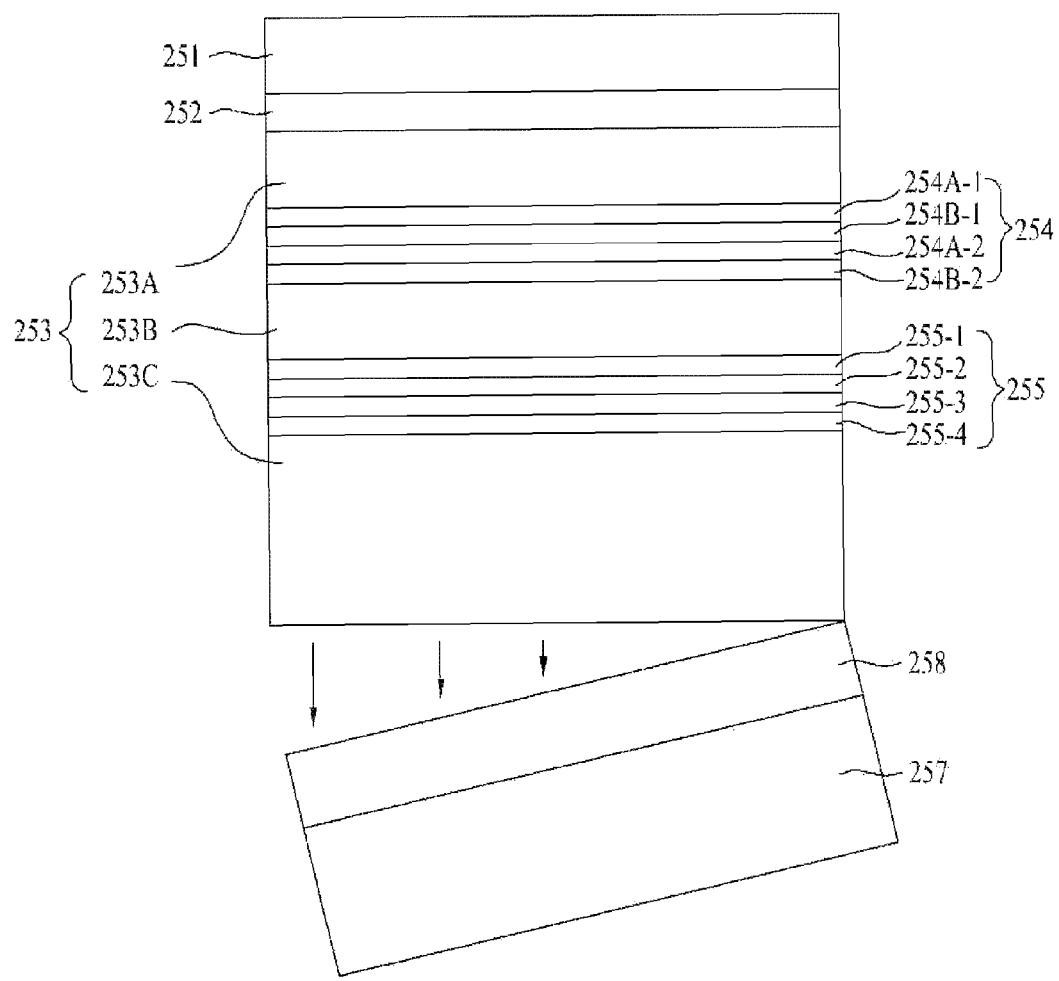

LIGHT EMITTING DEVICE PACKAGE

CROSS REFERENCE TO RELATED APPLICATION

This application claims priority under 35 U.S.C. §119 to Korean Patent Applications No. 10-2011-0132886, filed in Korea on Dec. 12, 2011 and No. 10-2012-0137768, filed in Korea on Nov. 30, 2012, which are hereby incorporated in their entirety by references as if fully set forth herein.

TECHNICAL FIELD

Embodiments relate to a light emitting device package.

BACKGROUND

Light emitting diodes are a kind of semiconductor device that converts electricity into light (e.g., infrared light) by using the characteristics of a compound semiconductor to transmit and receive a signal or are used as light sources.

Group III-V nitride semiconductors have been in the spotlight as a core material for light emitting devices, such as light emitting diodes (LEDs), laser diodes (LDs), and the like, because of their excellent physical and chemical properties.

Such LEDs do not contain environmentally harmful materials such as mercury (Hg) which are used in existing lighting equipment, such as glow lamps and fluorescent lamps and thus exhibit excellent eco-friendliness, long lifespan, and low power consumption. Thus, these LEDs are replacing conventional light sources.

In a general light emitting device, a light-emitting structure is grown on a substrate in a c-direction (i.e., direction), which is a polarization direction. As for a grown light emitting device having such a crystal structure, a built-in electric field is induced by piezoelectric and spontaneous polarization due to the characteristics of the crystal structure, and accordingly, a quantum-confined stark effect occurs by the induced electric field. The built-in electric field reduces recombination efficiency of carriers in an active layer of a light emitting device by separating electrons and holes from each other and causes red-shift of wavelengths. Thus, a color reproduction range of a light emitting device package including such a light emitting device may be changed or the light emitting device package may unstably display colors.

SUMMARY

Embodiments provide a light emitting device package that has a stable color reproduction range, stably displays colors, and has excellent heat dissipation characteristics and improved doping efficiency.

In one embodiment, a light emitting device package includes a body having a cavity; at least one insulating layer disposed on the body; first and second electrode layers disposed on the insulating layer and electrically isolated from each other; at least one light emitting device disposed on a bottom surface of the cavity and electrically connected to the first and second electrode layer; a light-transmissive resin layer sealing the light emitting device disposed in the cavity; and a metal layer disposed on a rear surface of the body to face the light emitting device, wherein the light emitting device is grown in a non-polar direction on a substrate and includes a light emitting structure including a first conductive semiconductor layer, and active layer, and a second conductive semiconductor layer.

The light emitting structure may be grown in a non-polar a-direction on the substrate of an r-direction, or may be grown in a non-polar m-direction on a (1123) plane of the substrate.

The metal layer may have a larger width than that of the light emitting device. Light emitted from the light emitting device has a color purity of at least 0.5.

The light-transmissive resin layer may include at least one of a plurality of phosphors. The phosphors may include a first phosphor having a light emitting wavelength of 480 nm to 500 nm and a second phosphor having a light emitting wavelength of 580 nm to 620 nm. The light emitting device may emit light having a near-ultraviolet light wavelength.

The light emitting device may further include a buffer layer grown in the non-polar direction between the substrate and the first conductive semiconductor layer. The buffer layer may have a dislocation density of $1\times10E9/cm^2$ to $1\times10E10/cm^2$.

The light-transmissive resin layer may include a first light-transmissive resin layer having a flat upper surface and may further include a second light-transmissive resin layer disposed on the first light-transmissive resin layer and having a dome-shaped upper portion. A refractive index of the second light-transmissive resin layer may be equal to or greater than that of the first light-transmissive resin layer. The insulating layer and the first and second electrode layer may not be formed on at least a portion of the bottom of the cavity and on a rear surface of the body on which the metal layer is disposed.

The light emitting device package may further include first and second diffusion layers formed in the body, electrically connected respectively to the first and second electrode layers, and including impurities injected thereto. The first and second diffusion layers may be respectively disposed on both sides of the upper surface of the body, based on the cavity.

The light emitting device package may further include at least one of third or fourth diffusion layers respectively disposed in top and bottom portions of the body that are not covered by the insulating layer and the first and second electrode layers and exposed. The third and fourth diffusion layers may be electrically isolated from the first and second electrode layers.

The light emitting device may further include a reflective layer disposed between the second conductive semiconductor layer and the active layer and including at least one double-layered structure including an $Al_xG_{1-x}N$ superlattice layer and an $Al_yG_{1-y}N$ superlattice layer, wherein x and y are different from each other, and thus, the $Al_xG_{1-x}N$ superlattice layer and the $Al_yG_{1-y}N$ superlattice layer have different refractive indexes.

The active layer may have at least one pair structure of a well layer and a barrier layer, and the reflective layer has a higher energy band gap than that of the barrier layer. Y may be greater than x. In an embodiment, $0.2 \leq x \leq 0.3$ and $0.3 \leq y \leq 1$.

The reflective layer may be doped with a second conductive dopant, and the second conductive semiconductor layer may include a material having a higher electrical conductivity than that of AlGaN.

BRIEF DESCRIPTION OF THE DRAWINGS

Arrangements and embodiments may be described in detail with reference to the following drawings in which like reference numerals refer to like elements and wherein:

FIGS. 9A through 9H are cross-sectional views illustrating a method for manufacturing the light emitting device of FIG. 7, according to embodiments;

DESCRIPTION OF SPECIFIC EMBODIMENTS

Figure 1:
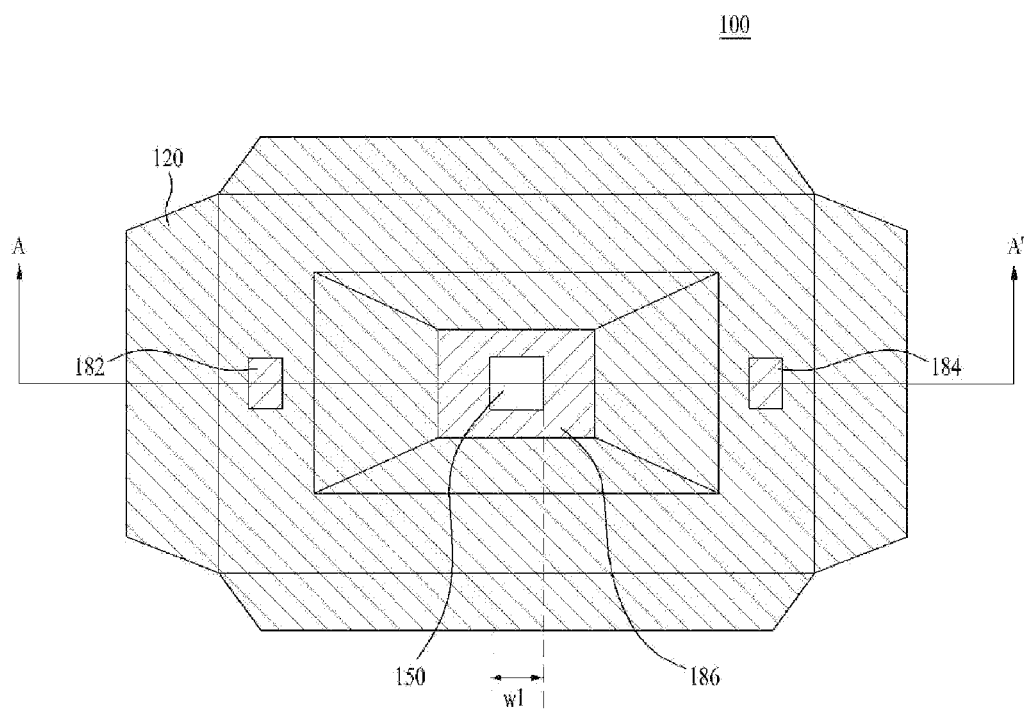
FIG. 1 is a plan view of a light emitting device package according to an embodiment.

Hereinafter, embodiments will be described with reference to the annexed drawings.

It will be understood that when an element is referred to as being "on" or "under" another element, it can be directly on/under the element, and one or more intervening elements may also be present.

When an element is referred to as being 'on' or 'under', 'under the element' as well as 'on the element' can be included based on the element.

The thickness or size of each layer in the drawings is exaggerated, omitted, or schematically illustrated for convenience of explanation and clarity. Also, the size of each element does not entirely reflect actual size thereof.

Figure 2:
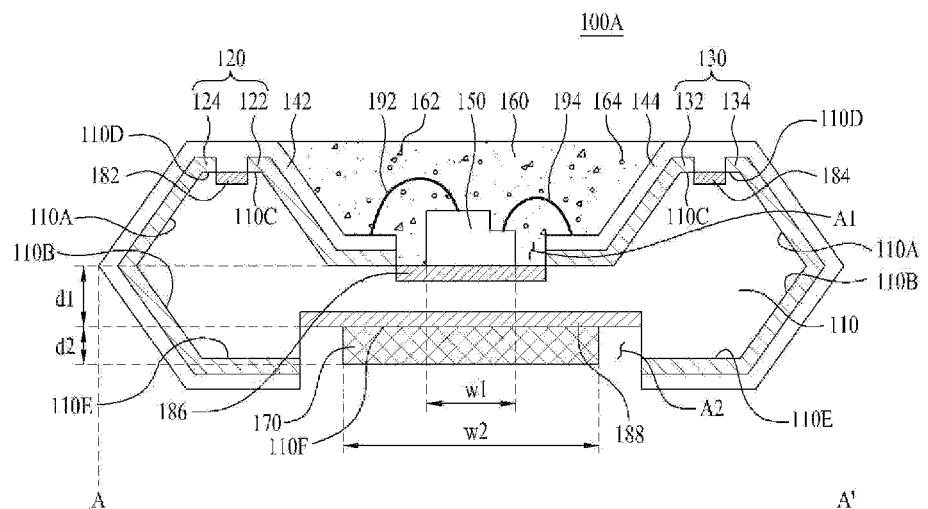
FIG. 2 is a cross-sectional view taken along the line A-A' of FIG. 1, illustrating a structure of the light emitting device package of FIG. 1 according to an embodiment.

FIG. 1 is a plan view of a light emitting device package 100 according to an embodiment. FIG. 2 is a cross-sectional view taken along line A-A' of FIG. 1, illustrating a structure of the light emitting device package of FIG. 1 according to an embodiment 100A. For convenience of explanation, a first light-transmissive resin layer 160, a first electrode layer 142, and a second electrode layer 144, which are shown in FIG. 2, are not illustrated in FIG. 1.

Referring to FIGS. 1 and 2, the light emitting device package 100 or the light emitting device package, which is designated by reference numeral "100A", includes a body 110, at least one insulating layer, e.g., first and second insulating layers 120 and 130, the first and second electrode layers 142 and 144, a light emitting device 150, the first light-transmissive resin layer 160, at least one phosphor, e.g., first and second phosphors 162 and 164, a metal layer 170, first, second, third and fourth diffusion layers 182, 184, 186 and 188, and wires 192 and 194.

The body 110 may be formed of a material having a high insulating property or a high thermal conductivity such as a silicon-based wafer level package (WLP), silicon, silicon carbide (SiC), and aluminum nitride (AlN), and may have a structure in which a plurality of substrates is stacked. Embodiments are not limited by a material, structure and shape of the body 110. The body 110 has a cavity at an upper portion thereof to a predetermined depth. The cavity may be in the form of any one of a base tube-shaped groove, a polygonal groove, and a circular groove.

As illustrated in FIG. 2, the circumference of the cavity of the body 110 may be inclined at a predetermined angle or at a predetermined curvature. Namely, an upper surface of the body 110 is disposed around the cavity at the center, and a portion of lateral surfaces of the body 110, e.g., left and right lateral surfaces may include an upper lateral surface 110A and a lower lateral surface 110B which are not vertical planes but rather are inclined at a predetermined angle.

At least one of the first and second insulating layers 120 and 130 may be disposed on the body 110. As illustrated in FIG. 1, the first and second insulating layers 120 and 130 may be disposed on a surface of the body 110. The first and second insulating layers 120 and 130 may be formed of a material having an insulating property, for example, a semiconductor compound. For example, the first and second insulating layers 120 and 130 may be formed of various kinds of insulating materials such as silicon oxide, AlN, SiC, alumina, and silicon nitride.

The first insulating layer 120 includes a 1A insulating layer 122 and a 1B insulating layer 124. The 1A and 1B insulating layers 122 and 124 are connected to each other, extend from a side of a bottom surface of the cavity to an inner side 110C of the upper surface of the body 110, and extend to an outer side 110D of the upper surface, the upper lateral surface 110A, the lower lateral surface 110B, and a portion of a rear surface 110E of the body 110.

The second insulating layer 130 includes a 2A insulating layer 132 and a 2B insulating layer 134. The 2A and 2B insulating layers 132 and 134 are connected to each other, extend from the other side of the bottom surface of the cavity to the inner side 110C of the upper surface of the body 110, and extend to the outer side 110D of the upper surface, the upper lateral surface 110A, the lower lateral surface 110B, and a portion of the rear surface 110E of the body 110.

The first and second insulating layers 120 and 130 may be integrally formed at a region except at least a portion (i.e., a first open region A1) of the bottom of the cavity and a second open region A2 of a rear surface 110F of the body 110, or may be formed below the first electrode layer 142 and the second electrode layer 144, respectively.

A thickness d1 between the bottom surface of the cavity of the body 110 and the rear surface 110F of the body 110 may be, for example, from 500 μM to 2000 μm in order to prevent the silicon substrate from being broken and to effectively transfer heat.

Next, the first and second diffusion layers 182 and 184 may be disposed at both sides of the upper surface of the body 110, the third diffusion layer 186 may be disposed at at least a portion of the bottom surface of the cavity of the body 110, and the fourth diffusion layer 188 may be further disposed at the rear surface 110F of the body 110.

The first diffusion layer 182 is disposed at an open region defined by the 1A and 1B insulating layers 122 and 124 that are respectively disposed on the inner and outer sides 110C and 110D of the upper surface of the body 110. The second diffusion layer 184 is disposed at an open region defined by the 2A and 2B insulating layers 132 and 134 that are respectively disposed on the inner and outer sides 110C and 110D of the upper surface of the body 110. Namely, the first and second diffusion layers 182 and 184 are respectively disposed on both sides of the upper surface of the body 110, based on the cavity. In addition, the first and second diffusion layers 182 and 184 may be formed by injecting an impurity having an opposite polarity to that of the silicon substrate 110, into both sides of the upper surface of the body 110. The first and second diffusion layers 182 and 184 may be configured as a Zener diode, but embodiments are not limited thereto.

The third diffusion layer 186 is disposed in a top portion of the body 110 exposed in the first open region A1 at the center of the bottom surface of the cavity, without being covered by the 1A and 2A insulating layers 122 and 132 and the first and second electrode layers 142 and 144. Namely, the third diffusion layer 186 is formed below the light emitting device 150.

The fourth diffusion layer 188 is formed in a lower portion of the body 110 exposed in the second open region A2 at the rear surface 110F of the body 110, without being covered by the 1B and 2B insulating layers 124 and 134 and the first and second electrode layers 142 and 144. Namely, the fourth diffusion layer 188 is disposed on the metal layer 170.

The third diffusion layer 186 and/or the fourth diffusion layer 188 are/is electrically isolated to the first and second electrode layers 142 and 144. Thus, since the third diffusion layer 186 and/or the fourth diffusion layer 188 are/is electrically isolated to the light emitting device 150 to be in a floating state, the third diffusion layer 186 and/or the fourth diffusion layer 188 act(s) as a Zener diode for protecting other devices or a constant-current transistor, but embodiments are not limited thereto.

The first and second electrode layers 142 and 142 having a predetermined pattern are respectively disposed on the first and second insulating layers 120 and 130. The first and second electrode layers 142 and 144 are electrically isolated from each other by the first and second open regions A1 and A2 and are disposed in the cavity region and on the inner and outer sides 110C and 110D of the upper surface, the lateral sides 110A and 110B and a portion of the rear surface 110E of the body 110. The first and second electrode layers 142 and 142 are not disposed on the first open region A1 of at least a portion of the bottom of the cavity and the second open region A2 of the rear surface 110F of the body 110.

The first and second electrode layers 142 and 142 may be used as at least two electrode leads. The number of electrode leads may vary according to patterns of the first and second electrode layers 142 and 142. In addition, the first and second electrode layers 142 and 142 are respectively disposed on the first and second diffusion layers 182 and 184 and are thus electrically connected to the first and second diffusion layers 182 and 184.

In addition, the first and second electrode layers 142 and 142 are connected to the light emitting device 150 via the wires 192 and 194 inside the cavity, and may be solder-bonded to a base substrate using a surface mount technology (SMT) at the rear and lateral surfaces of the body 110. Here, according to the patterns of the first and second electrode layers 142 and 142, the first and second diffusion layers 182 and 184 and the light emitting device 150 may be configured as a parallel circuit or as an independent circuit.

The first and second electrode layers 142 and 142 may be formed of an electrically conductive material. The first and second electrode layers 142 and 142 may have a single-layered or multi-layered structure of at least one metal, e.g., copper (Cu), nickel (Ni), gold (Au), and titanium (Ti), but embodiments are not limited thereto.

In some embodiments, at least one light emitting device 150 may be mounted within the cavity of the body 110. The light emitting device 150 is attached to the bottom surface of the cavity, i.e., the surface of the body 110. For example, the light emitting device 150 may be attached to an upper portion of the third diffusion layer 186 in the open region A1 within the cavity of the body 110, and may be electrically connected to the first and second electrode layers 142 and 144. The light emitting device 150 may be comprised of a colored LED chip such as a blue LED chip, a green LED chip, a red LED chip, or a yellow LED chip, or may be comprised of an ultraviolet (UV) LED chip. The kind and number of the light emitting device 150, however, are not limited thereto. In particular, the light emitting device 150 may be comprised of a near-ultraviolet LED chip that emits light having a near UV (NUV) wavelength.

Figure 3:
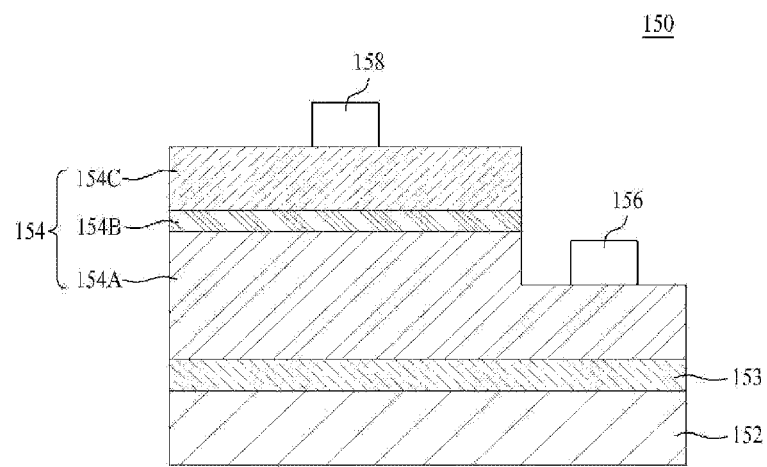
FIG. 3 is a cross-sectional view of a light emitting device according to an embodiment.

FIG. 3 is a cross-sectional view of a light emitting device 150 according to an embodiment.

Referring to FIG. 3, the light emitting device 150 includes a substrate 152, a buffer layer 153, a light emitting structure 154, a first electrode 156, and a second electrode 158.

In the light emitting device 150, the buffer layer 153 and the light emitting structure 154 may be grown on the substrate 152 in a non-polar direction. According to an embodiment, the buffer layer 153 and the light emitting structure 154 may be grown in a non-polar a-direction on the substrate 152 of an r-direction. According to another embodiment, the buffer layer 153 and the light emitting structure 154 may be grown in a non-polar m-direction on the (1123) plane of the substrate 152. Here, the (1123) plane indicates (1123) plane.

The substrate 152 may be formed of a material suitable for semiconductor growth, including a compound semiconductor. For example, the substrate 152 may be formed of at least one of sapphire ($Al_2O_3$), SiC, GaAs, GaN, ZnO, Si, GaP, InP, or Ge, but embodiments are not limited thereto.

In addition, the substrate 152 may prevent the entire nitride semiconductor from being bent and have a mechanical strength sufficient to be separated into separate chips through a scribing process and a breaking process.

The buffer layer 153 may be disposed between the substrate 152 and a first conductive semiconductor layer 154A and may be single-layered or multi-layered. For example, the buffer layer 153 may have a dislocation density of $1\times10E9/cm^2$ to $1\times10E10/cm^2$. In addition, the buffer layer 153 may have a thickness of 2 µl to 5 µm and a full width at half maximum (FWHM) of 400 arcsec or less in an X-ray diffraction (XRD) rocking curve.

The light emitting structure 154 is disposed on the buffer layer 153 and includes the first conductive semiconductor layer 154A, an active layer 154B, and a second conductive semiconductor layer 154C. Each of the first conductive semiconductor layer 154A, the active layer 154B, and the second conductive semiconductor layer 154C may be in a non-polar a-direction grown on the substrate 152 of r-direction or may be grown in a non-polar m-direction on the (1123) plane of the substrate 152.

The first conductive semiconductor layer 154A is disposed on the buffer layer 153 and may be formed of a semiconductor compound. The first conductive semiconductor layer 154A may be formed of a Group III-V compound semiconductor, a Group II-VI compound semiconductor, or the like and may be doped with a first conductive dopant. For example, the first conductive semiconductor layer 154A may be formed of at least one of a semiconductor material having a formula of $Al_aIn_bGa_{(1-a-b)}N$ where $0 \le a \le 1$, $0 \le b \le 1$, and $0 \le a+b \le 1$, InAlGaN, AlGaAs, GaP, GaAs, GaAsP, or AlGaInP. For example, a may be 0.04 to 0.08. When the first conductive semiconductor layer 154A is formed as an n-type semiconductor layer, the first conductive dopant may be an n-type dopant such as Si, Ge, Sn, Se, Te, or the like. The first conductive semiconductor layer 154A may be single-layered or multi-layered, but embodiments are not limited thereto. For example, the first conductive semiconductor layer 154A may have a thickness of 2 µm to 3 µm.

The active layer 154B is formed on the first conductive semiconductor layer 154A and may have any one of a single well structure, a multi well structure, a single quantum well structure, a multi quantum well (MQW) structure, a quantum dot structure, and a quantum wire structure. The active layer 154B may have at least one pair structure of a well layer and a barrier layer of a Group III-V element compound semiconductor material, for example, of InGaN/GaN, InGaN/InGaN, GaN/AlGaN, InAlGaN/GaN, GaAs(InGaAs)/AlGaAs, and GaP(InGaP)/AlGaP, but embodiments are not limited thereto. For example, the active layer 154B may have a structure of three to five pairs of a well layer and a barrier layer. The well layer may be formed of a material having a lower energy band gap than that of the barrier layer. In particular, the active layer 154B may generate light having a near-ultraviolet wavelength band, e.g., a wavelength band of 330 nm to 405 nm.

When the barrier layer of the active layer 154B is formed of AlGaN, an n-type dopant may be doped from a second or third barrier layer which is disposed close to an electron blocking layer in order to improve injection of carriers. The active layer 154B grown by such a process may emit light having a wavelength band of 330 nm to 405 nm.

A conductive clad layer (not shown) may be formed between the active layer 154B and the first conductive semiconductor layer 154A or between the active layer 154B and the second conductive semiconductor layer 154C. The conductive clad layer may be formed of a semiconductor having a higher energy band gap than that of the barrier layer of the active layer 154B. For example, the conductive clad layer may be formed of GaN, AlGaN, or InAlGaN or may have a super lattice structure. Also, the conductive clad layer may be doped with an n-type or p-type dopant.

The second conductive semiconductor layer 154C may be formed of a semiconductor compound, for example, of a Group III-V compound semiconductor, a Group II-VI compound semiconductor, or the like, and may be doped with a second conductive dopant. For example, the second conductive semiconductor layer 154C may be formed of a semiconductor material having a formula of $In_aAl_bGa_{1-a-b}N$ where $0 \leq a \leq 1$, $0 \leq b \leq 1$, and $0 \leq a+b \leq 1$, or at least one of AlInN, AlGaAs, GaP, GaAs, GaAsP, or AlGaInP. When the second conductive semiconductor layer 154C is formed as a p-type semiconductor layer, the second conductive dopant may be a p-type dopant such as Mg, Zn, Ca, Sr, or Ba. The second conductive semiconductor layer 154C may be single-layered or multi-layered, but embodiments are not limited thereto. When the second conductive semiconductor layer 154C is formed of AlGaN, the composition ratio a of Al may be 0.04 to 0.08.

Next, the first electrode 156 may contact the first conductive semiconductor layer 154A and be formed of a metal. For example, the first electrode 156 may be formed of one selected from Ag, Ni, Al, Rh, Pd, Ir, Ru, Mg, Zn, Pt, Au, Hf, and combinations thereof. In addition, the first electrode 156 may be single-layered or multi-layered using a reflective electrode material having an ohmic property. Also, the first electrode 156 may include the above-listed metal material and at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, or Ni/IrOx/Au/ITO, but embodiments are not limited thereto. The first electrode 156 may include a material in ohmic contact with the first conductive semiconductor layer 154A. When the first electrode 156 has an ohmic function, an ohmic layer (not shown) may not be formed.

The second electrode 158 is formed on the second conductive semiconductor layer 154C and may include the same material as that of the first electrode 156.

The first and second electrodes 156 and 158 are respectively connected to the second and first electrode layers 144 and 142 via the wires 194 and 192, respectively.

The first light-transmissive resin layer 160 that seals the light emitting device 150 is disposed within the cavity. The first light-transmissive resin layer 160 may be formed of any material for sealing a cavity. For example, the first light-transmissive resin layer 160 may be formed of a transparent resin material such as silicon or epoxy.

In addition, the first light-transmissive resin layer 160 may include at least one phosphor, and the kind of the phosphor is not particularly limited. As illustrated in FIG. 2, at least one of a plurality of phosphors may be included in the first light-transmissive resin layer 160.

For example, the first light-transmissive resin layer 160 may include the first phosphor 162 having a light emitting wavelength of 480 nm to 500 nm and the second phosphor 164 having a light emitting wavelength of 580 nm to 620 nm. Here, the first phosphor 162 may be a cyan phosphorescent material, and the second phosphor 164 may be an orange phosphorescent material. In this case, the light emitting device package 100A may emit white light having a wavelength of 360 nm to 420 nm.

In the second open region A2, the metal layer 170 is disposed on the rear surface 110F of the body 110 to face the light emitting device 150. The metal layer 170 may be formed of the same material as that of the first and second electrode layers 142 and 144 or of other metal materials having heat dissipation properties. The metal layer 170 is formed below the fourth diffusion layer 188 that faces the light emitting device 150 and dissipates heat generated from the light emitting device 150. Here, when a width w2 of the metal layer 170 is larger than a width w1 of the light emitting device 150, more effective heat dissipation properties may be obtained. The metal layer 170 may have a thickness d2 of 0.5 μm to 100 μm, but embodiments are not limited thereto.

In addition, as illustrated in FIG. 2, the first light-transmissive resin layer 160 may have a flat upper portion.

Figure 4:
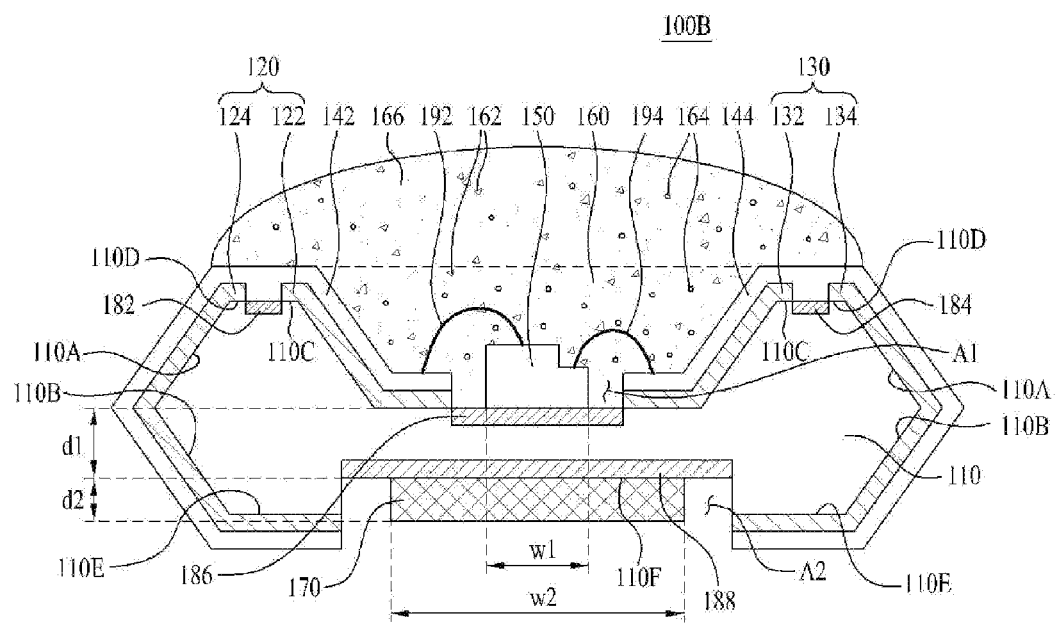
FIG. 4 is a cross-sectional view taken along the line A-A' of FIG. 1, illustrating a structure of the light emitting device package of FIG. 1 according to another embodiment.

FIG. 4 is a cross-sectional view taken along line A-A' of FIG. 1, illustrating a structure of the light emitting device package 100 of FIG. 1 according to another embodiment 100B.

In this regard, while the light emitting device package 100A of FIG. 2 includes only the first light-transmissive resin layer 160, the light emitting device package of FIG. 4, which is designated by reference numeral "100B", includes a second light-transmissive resin layer 166 as well as the first light-transmissive resin layer 160 and. Except for this difference, the light emitting device package 100B of FIG. 4 has the same structure as that of the light emitting device package 100A of FIG. 2, and thus, like elements denote like reference numerals and a detailed description thereof is not provided herein.

In the light emitting device package 100B of FIG. 4, the second light-transmissive resin layer 166 is disposed on the first light-transmissive resin layer 160 and may have a dome-shaped convex upper portion. Here, the second light-transmissive resin layer 166 may mean a dome lens. As described above, when the dope-shaped second light-transmissive resin layer 166 is disposed on the first light-transmissive resin layer 160, increased efficiency in amount of light may be obtained and orientation angles may be adjusted. In addition, a refractive index of the second light-transmissive resin layer 166 may be equal to or greater than that of the first light-transmissive resin layer 160.

In addition, as illustrated in FIG. 4, each of the first and second light-transmissive resin layer 160 and 166 includes both the first and second phosphors 162 and 164, but embodiments are not limited thereto. Namely, in some embodiments, only the first or second light-transmissive resin layer 160 or 166 may include at least one of the first and second phosphors 162 or 164.

In the above-described light emitting device packages 100A and 100B, when a voltage is applied to the first and second electrode layers 142 and 144, the light emitting device 150 is driven by receiving the voltage from the first and second electrode layers 142 and 144 via wires 192 and 194, respectively, and thus emits light.

When the light emitting device packages 100, 100A and 100B including a near-ultraviolet light emitting device 150 and at least one of the first or second light-transmissive resin layers 160 and 166 including the first and second phosphors 162 and 164 are used, a high color reproducibility of 90% to 120% for national television system committee (NTSC), may be achieved. In addition, a high color reproducibility of 90% to 120% may be achieved even for another index corresponding to NTSC (e.g., Adobe RGB, sRGB, PhotoRGB, or the like).

The heat generated from the light emitting device 150 is transferred and dissipated via the body 110 and the metal layer 170 disposed therebelow. Namely, the heat generated from the light emitting device 150 is transferred via the body 110 and the metal layer 170 and then dissipated to the outside.

When the light emitting device 150 is a near-ultraviolet light emitting device having excellent luminescent characteristics, the heat generated therefrom may be very high. When a light emitting device package having the above-described heat dissipation structure is used, however, such high heat may be effectively dissipated to the outside.

Although it is illustrated in FIGS. 1, 2 and 4 that the light emitting device packages 100, 100A and 100B each include a horizontal-type light emitting device as the light emitting device 150, embodiments are not limited thereto. Namely, the light emitting device 150 of each of the light emitting device packages 100, 100A and 100B may be a flip chip bonding-type light emitting device or a vertical-type light emitting device which will be described below.

Figure 5:
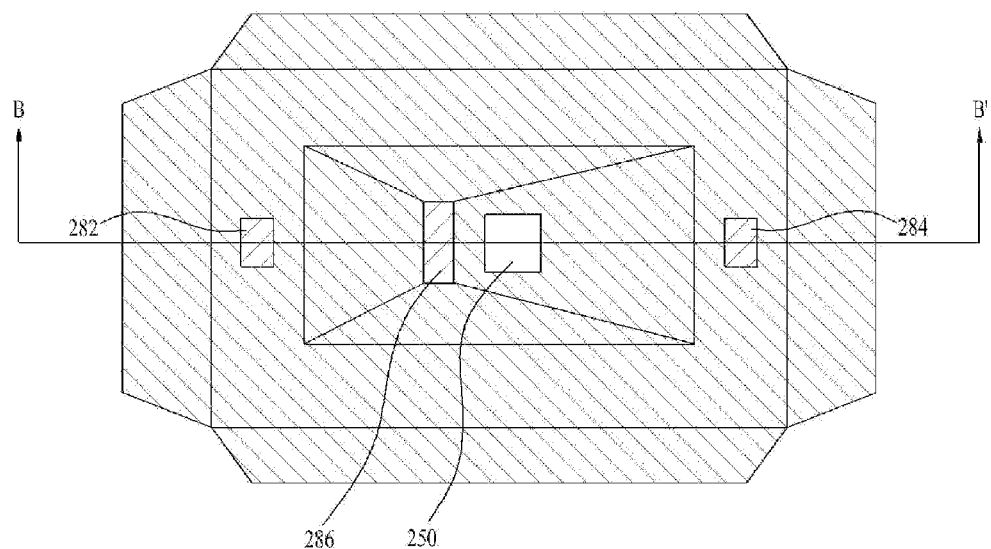
FIG. 5 is a plan view of a light emitting device package according to another embodiment.
Figure 6:
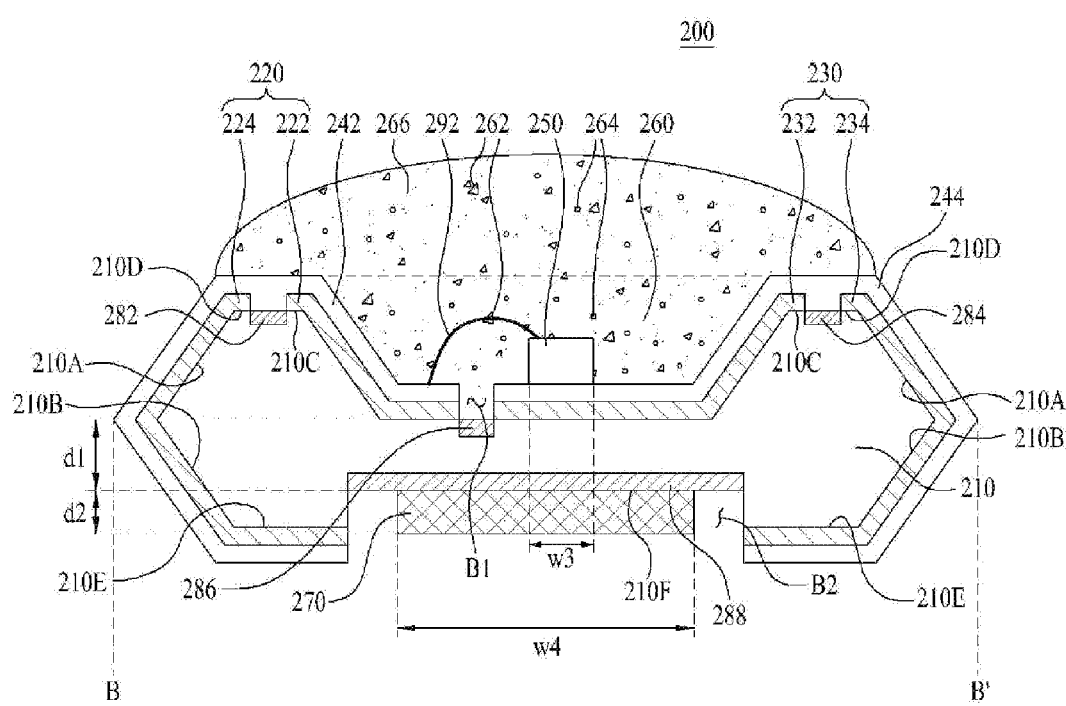
FIG. 6 is a cross-sectional view taken along line B-B' of FIG. 5.

FIG. 5 is a plan view of a light emitting device package 200 according to another embodiment. FIG. 6 is a cross-sectional view taken along line B-B' of FIG. 5. For convenience of explanation, first and second light-transmissive resin layers 260 and 266 and first and second electrode layers 242 and 244, which are illustrated in FIG. 6, are not illustrated in FIG. 5.

A body 210, at least one of the first and second insulating layer 220 and 230, a first electrode layer 242, a second electrode layer 244, the first and second light-transmissive resin layers 260 and 266, at least one of the first and second phosphor 262 and 264, a metal layer 270, first, second and fourth diffusion layers 282, 284 and 288 illustrated in FIG. 6 respectively correspond to the body 110, at least one of the first and second insulating layer 120 and 130, the first and second electrode layers 142 and 144, the first and second light-transmissive resin layers 160 and 166, at least one of the first and second phosphor 162 and 164, the metal layer 170, the first, second and fourth diffusion layers 182, 184 and 188 illustrated in FIG. 4. Thus, a 1A insulating layer 222 and a 1B insulating layer 224 of the first insulating layer 220 illustrated in FIG. 6 respectively correspond to the 1A insulating layer 122 and the 1B insulating layer 124 of the first insulating layer 120 illustrated in FIG. 4. In addition, a 2A insulating layer 232 and a 2B insulating layer 234 of the second insulating layer 230 illustrated in FIG. 6 respectively correspond to the 2A insulating layer 132 and the 2B insulating layer 134 of the second insulating layer 130 illustrated in FIG. 4. In addition, an upper lateral surface 210A, a lower lateral surface 210B, an inner side 210C of an upper surface, and an outer side 210D of the upper surface of the body 210 of FIG. 6 respectively correspond to the upper lateral surface 110A, the lower lateral surface 110B, the inner portion 110C of the upper surface, and the outer portion 110D of the upper surface of the body 110 of FIG. 4. In addition, thicknesses d1 and d2 illustrated in FIG. 6 respectively correspond to the thicknesses d1 and d2 illustrated in FIG. 4. Thus, a detailed description of the elements of FIG. 6 that correspond to those of FIG. 4 is not provided herein, and only a detailed description of elements of the light emitting device package 200 of FIG. 6 which are different from those of the light emitting device package 100B of FIG. 4 is provided herein.

The third diffusion layer 286 is disposed in a top portion of the body 210 exposed in a first open region B1 of a portion of the bottom surface of the cavity, without being covered by the 1A and 2A insulating layers 222 and 232 and the first and second electrode layers 242 and 244. The third diffusion layer 286 is electrically isolated to the first and second electrode layers 242 and 244. Since the third diffusion layer 286 is electrically isolated from the light emitting device 250 to be in a floating state, the third diffusion layer 286 acts as a constant current transistor or a Zener diode for protecting other devices, but embodiments are not limited thereto.

In FIG. 6, when a width w4 of the metal layer 270 is larger than a width w3 of the light emitting device 250, more effective heat dissipation properties may be obtained.

In some embodiments, at least one light emitting device 250 may be mounted within the cavity of the body 210. The light emitting device 250 is disposed on the second electrode layer 244 within the cavity and thus is electrically connected directly to the second electrode layer 244 and electrically connected to the first electrode layer 242 via the wire 292. The light emitting device 250 may be comprised of a colored LED chip such as a blue LED chip, a green LED chip, a red LED chip, or a yellow LED chip, or may be comprised of a UV LED chip. The kind and number of the light emitting device 250, however, are not limited thereto. In particular, the light emitting device 250 may be comprised of a NUV LED chip that emits light having a wavelength of NUV.

Figure 7:
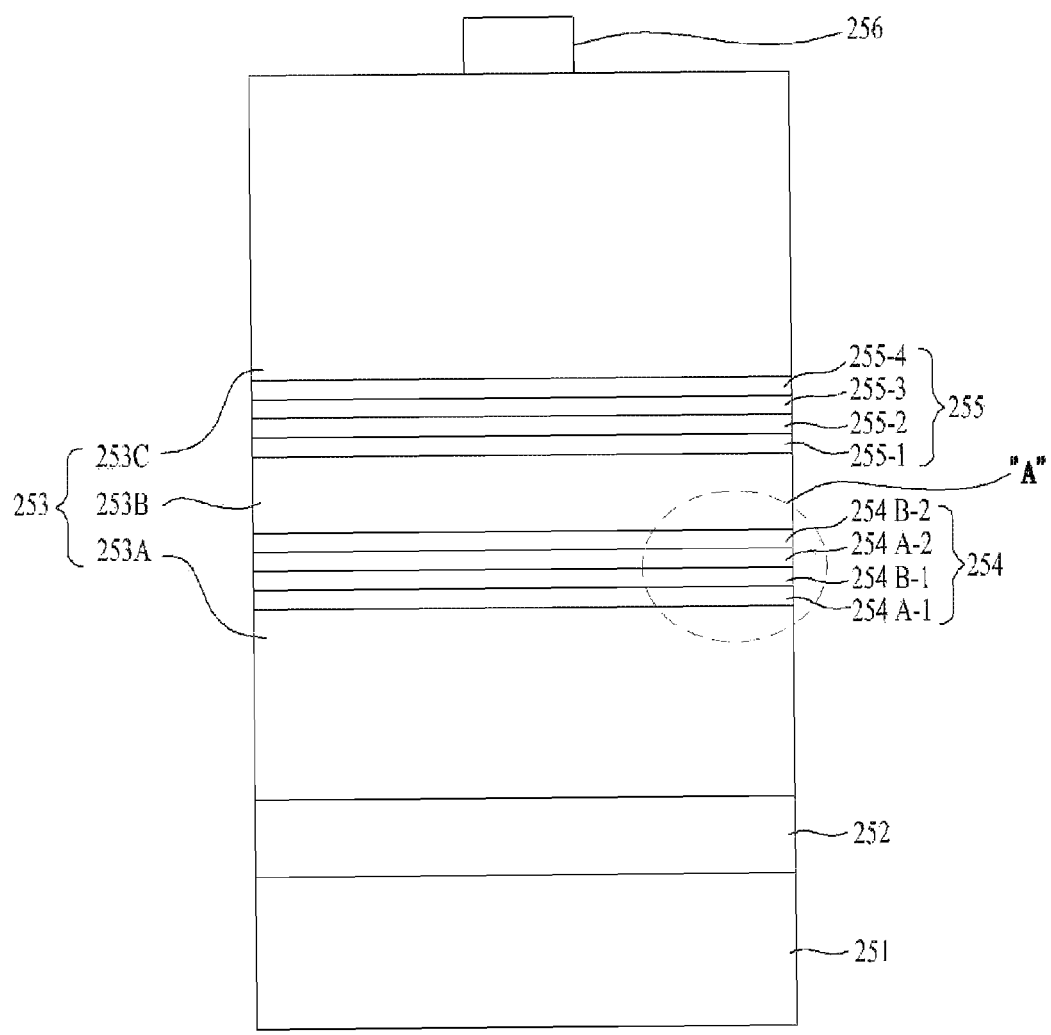
FIG. 7 is a cross-sectional view of a light emitting device according to an embodiment.

FIG. 7 is a cross-sectional view of the light emitting device 250 of the light emitting device package 200 of FIG. 6.

The light emitting device 250 of FIG. 7 includes a supporting substrate 251, a first electrode layer 256, a light emitting structure 253, a reflective layer 254, an intermediate layer 255, and a second electrode layer 252.

The supporting substrate 251 is disposed below the light emitting structure 253. The supporting substrate 251 may act as an electrode together with the second electrode layer 252, and thus, may be formed of a highly electrically conductive metal. In addition, the supporting substrate 251 needs to sufficiently dissipate heat generated during operation of the light emitting device 250, and thus, may be formed of a metal having high thermal conductivity.

For example, the supporting substrate 251 may be formed of a material selected from the group consisting of molybdenum (Mo), silicon (Si), tungsten (W), copper (Cu), and aluminum (Al) or an alloy thereof. In addition, the supporting substrate 251 may optionally include gold (Au), a Cu alloy, nickel (Ni), Cu—W, a carrier wafer (e.g., GaN, Si, Ge, GaAs, ZnO, SiGe, SiC, SiGe, $Ga_2O_3$, etc), or the like.

In addition, the supporting substrate 251 may prevent the entire nitride semiconductor from being bent and have a mechanical strength sufficient to be separated into separate chips through a scribing process and a breaking process.

The second electrode layer 252 is disposed between the supporting substrate 251 and a second conductive semiconductor layer 253A. The second conductive semiconductor layer 253A has a low impurity doping concentration and thus has a high contact resistance, and accordingly, has a poor ohmic property. In this regard, the second electrode layer 252 may improve such an ohmic property and be formed of a transparent electrode.

The second electrode layer 252 may have a thickness of about 200 Å. For example, the second electrode layer 252 may be formed of at least one of ITO, IZO, IZTO, IAZO, IGZO, IGTO, AZO, ATO, GZO, IZO nitride (IZON), Al—Ga ZnO (AGZO), In—Ga ZnO (IGZO), ZnO, $IrO_x$, $RuO_x$, NiO, $RuO_x$/ITO, Ni/$IrO_x$/Au, Ni/$IrO_x$/Au/ITO, Ag, Ni, Cr, Ti, Al, Rh, Pd, Ir, Sn, In, Ru, Mg, Zn, Pt, Au, or Hf, but embodiments are not limited thereto.

Although not illustrated in FIG. 7, a bonding layer may be further formed between the supporting substrate 251 and the second electrode layer 252. The bonding layer may be an adhesion layer that adheres the second electrode layer 252 to the supporting substrate 251. When the second electrode layer 252 acts as an adhesion layer, however, the adhesion layer is not needed. The adhesion layer may be formed of, for example, a material selected from the group consisting of Au, Sn, In, Al, Si, Ag, Ni, and Cu or an alloy thereof.

The light emitting structure 253 includes the second conductive semiconductor layer 253A, an active layer 253B, and a first conductive semiconductor layer 253C which are sequentially disposed on the supporting substrate 251. The light emitting structure 253 is grown in a non-polar direction on a substrate 257 as later illustrated in FIGS. 9A through 9F. According to an embodiment, the light emitting structure 253 may be grown in a non-polar a-direction on the substrate 257 of an r-direction. Alternatively, the light emitting structure 253 may be grown in a non-polar in-direction on the (1123) plane of the substrate 257. The first conductive semiconductor layer 253C is disposed over the active layer 253B. The active layer 253B is disposed between the second conductive semiconductor layer 253A and the first conductive semiconductor layer 253C and emits light. The second conductive semiconductor layer 253A is disposed on the second electrode layer 252. In particular, the active layer 253B may emit light having an NUV wavelength, i.e., a wavelength band from 330 nm to 405 nm.

The first conductive semiconductor layer 253C may be formed of a semiconductor compound. The first conductive semiconductor layer 253C may be formed of a Group III-V compound semiconductor, a Group II-VI compound semiconductor, or the like and may be doped with a first conductive dopant. For example, the first conductive semiconductor layer 253C may include a semiconductor material having a formula of $Al_aIn_bGa_{(1-a-b)}N$ where $0 \leq a \leq 1$, $0 \leq b \leq 1$, and $0 \leq a+b \leq 1$. Also, the first conductive semiconductor layer 253C may be formed of at least one of GaN, InN, AlN, InGaN, AlGaN, InAlGaN, AlInN, AlGaAs, InGaAs, AlInGaAs, GaP, AlGaP, InGaP, AlInGaP, or InP. When the first conductive semiconductor layer 253C is formed as an n-type semiconductor layer, the first conductive dopant may be an n-type dopant such as Si, Ge, Sn, Se, or Te, but embodiments are not limited thereto. For example, the first conductive semiconductor layer 253C may have a thickness of 2 μm to 3 μl. When the first conductive semiconductor layer 253C is formed of AlGaN, the composition ratio a of Al may be 0.04 to 0.08 and the composition ratio of Ga may be 0.92 to 0.96.

The active layer 253B emits light having an energy determined by an intrinsic energy band of a material constituting the active layer 253B, by combination of holes (or electrons) injected via the second conductive semiconductor layer 253A and electrons (or holes) injected via the first conductive semiconductor layer 253C.

The active layer 253B may have at least one of a single well structure, a multi well structure, a single quantum well structure, an MQW structure, a quantum wire structure, or a quantum dot structure. For example, the active layer 253B may have an MQW structure formed by injecting trimethyl gallium (TMGa) gas, ammonia ($NH_3$) gas, nitrogen ($N_2$) gas, and trimethyl indium (TMIn) gas, but embodiments are not limited thereto.

The active layer 253B may have at least one pair structure of a well layer/a barrier layer of InGaN/GaN, InGaN/InGaN, GaN/AlGaN, InAlGaN/GaN, GaAs(InGaAs)/AlGaAs, or GaP(InGaP)/AlGaP, but embodiments are not limited thereto. For example, the active layer 253B may have a structure of three to five pairs of a well layer and a barrier layer. The well layer may be formed of a material having a lower energy band gap than that of the barrier layer.

A conductive clad layer (not shown) may be formed over and/or below the active layer 253B. The conductive clad layer may be formed of a semiconductor having a higher energy band gap than that of the barrier layer of the active layer 253B. For example, the conductive clad layer may include GaN, AlGaN, or InAlGaN or may have a super lattice structure. In addition, the conductive clad layer may be n-type or p-type doped.

The second conductive semiconductor layer 253A may be formed of a compound semiconductor, for example, of a Group III IV compound semiconductor, a Group II-V compound semiconductor, or the like, and may be doped with a second conductive dopant. For example, the second conductive semiconductor layer 253A may be formed of a semiconductor material having a formula of $In_aAl_bGa_{1-a-b}N$ where $0 \leq a \leq 1$, $0 \leq b \leq 1$, and $0 \leq a+b \leq 1$. For example, a may be 0.04 to 0.08. When the second conductive semiconductor layer 253A is a p-type semiconductor layer, the second conductive dopant may be a p-type dopant such as Mg, Zn, Ca, Sr, or Ba. In particular, according to the present embodiment, even when the active layer 253B can emit NUV light, the second conductive semiconductor layer 253A may be formed of GaN instead of AlGaN.

The first conductive semiconductor layer 253C may be formed as an n-type semiconductor layer, and the second conductive semiconductor layer 253A may be formed as a p-type semiconductor layer. Alternatively, a first conductive semiconductor layer 253C may be an p-type semiconductor layer, and the second conductive semiconductor layer 253A may be formed as an n-type semiconductor layer. The light emitting structure 253 may be constructed in any one structure of an n-p junction structure, a p-n junction structure, an n-p-n junction structure, and a p-n-p junction structure.

A case in which a first conductive type is an n type and a second conductive type is a p type will be described below, but an opposite case in which the first conductive type is a p type and the second conductive type is an n type may also be applied to embodiments.

The light emitting device 250 may further include the reflective layer 254 between the second conductive semiconductor layer 253A and the active layer 253B. The reflective layer 254 may include at least one double-layered structure including two layers which are $Al_xG_{1-x}N$ superlattice layer 254B-1 and $Al_yG_{1-y}N$ superlattice layer 254A-1, or which are $Al_xG_{1-x}N$ superlattice layer 254B-2 and $Al_yG_{1-y}N$ superlattice layer 254A-2.

Figure 8:
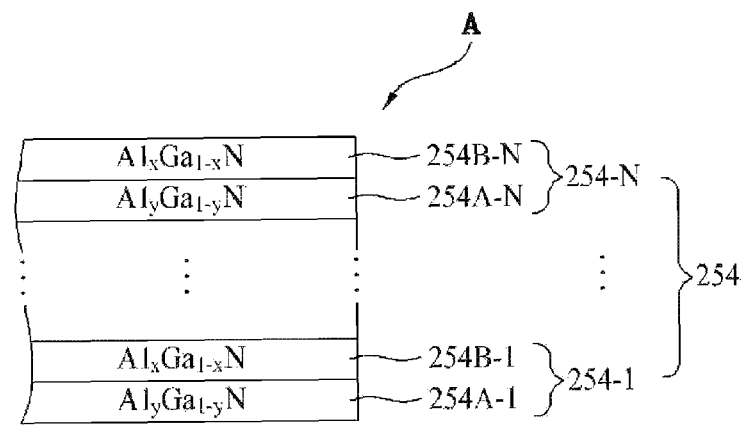
FIG. 8 is a partial cross-sectional enlarged view of a portion "A" of FIG. 7.

FIG. 8 is a partial enlarged cross-sectional view of a portion "A" illustrated in FIG. 7.

Referring to FIG. 8, the reflective layer 254 may have N-number of double-layered structures 254-1, ..., 254-N. Here, N is a positive integer of at least 1. Each double-layered structure 254-1, ..., 254-N includes $Al_xG_{1-x}N$ superlattice layer 254B-1 or 254B-2 and $Al_yG_{1-y}N$ superlattice layer 254A-1 or 254A-2. For example, a first double-layered structure 254-1 includes the $Al_xG_{1-x}N$ superlattice layer 254B-1 and the $Al_yG_{1-y}N$ superlattice layer 254A-1, and an $N^{th}$ double-layered structure 254-N includes an $Al_xG_{1-x}N$ superlattice layer 254B-N and an $Al_yG_{1-y}N$ superlattice layer 254A-N. In each double-layered structure 254-1, ..., 254-N, the $Al_yG_{1-y}N$ supperlattice layers 254A-1, ..., 254-N may be bottom layers, and the $Al_xG_{1-x}N$ superlattice layers 254B-1, ..., 254B-N may be top layers disposed on the bottom layers 254A-1, ..., 254-N.

In addition, the number N of the double-layered structures 254-1, ..., 254-N included in the reflective layer 254 may be 20 to 50, for example, 30.

For convenience of explanation, the light emitting device 250 of FIGS. 7 and 8 is described assuming that N is 2, but embodiments are not limited thereto. Namely, the same may also be applied to a case in which N is 1 or greater than 2.

Referring back to FIG. 7, in each of the double-layered structure 254-1 and 254-2, x and y are different from each other. Thus, the $Al_xG_{1-x}N$ superlattice layer 254B-1 (or 254B-2) has a different refractive index from that of the $Al_yG_{1-y}N$ superlattice layer 254A-1 (or 254A-2). Thus, when the $Al_xG_{1-x}N$ superlattice layer 254B-1 (or 254B-2) and the $Al_yG_{1-y}N$ superlattice layers 254A-1 (Or 254A-2) having different refractive indexes are stacked alternately upon one another so as to have a multi-layered structure, the reflective layer 254 functions as a distributed bragg reflector (DBR) and thus has an increased reflectance. Accordingly, the reflective layer 254 can reflect light emitted from the active layer 254B.

The more a difference between the refractive indexes of the $Al_xG_{1-x}N$ superlattice layer 254B-1 (or 254B-2) and the $Al_yG_{1-y}N$ superlattice layer 254A-1 (or 254A-2) increases, the more reflectance may increase, and thus, the stacking number N may be reduced. The reflective layer 254 functioning as a DBR may be configured such that a low refractive index layer and a high refractive index layer are stacked alternately upon one another to a thickness of $\lambda/4n$. Here, $\lambda$ denotes a wavelength of emitted light and n denotes a refractive index of a medium. The $Al_xG_{1-x}N$ superlattice layers 254B-1 and 254B-2 may correspond to low refractive index layers, and the $Al_yG_{1-y}N$ superlattice layers 254A-1 and 254A-2 may correspond to high refractive index layer.

In addition, the reflective layer 254 may have a higher energy band gap than a wavelength of light emitted from the active layer 253B so as not to absorb light.

Moreover, according to an embodiment, the reflective layer 254 may have a higher energy band gap than that of the barrier layer of the active layer 253B. This is intended for the reflective layer 254 to act as an electron blocking layer (EBL) that blocks a first conductive carrier (i.e., electrons) supplied from the first conductive semiconductor layer 253C to the active layer 253B from moving into the second conductive semiconductor layer 253A.

In order for the reflective layer 254 to act as both a DBR and an EBL, y may be greater than x. For example, $0.2 \leq x \leq 0.3$ and $0.3 \leq y \leq 1$.

Reflectance may vary according to the x and y values and reflectance of the reflective layer 254 may vary according to a wavelength of light emitted from the active layer 253B. According to an embodiment, x and y may be determined within the above-described range so that the reflective layer 254 has a reflectance of 50% to 900.

Also, an EBL (not shown) may be further disposed between the reflective layer 254 and the active layer 253B. Alternatively, in the light emitting device 250 of FIG. 7, an EBL (not shown) may be disposed instead of the reflective layer 254. In this case, the EBL may be formed of AlGaN. Here, the composition ratio of Al may be 0.18 to 0.25. The EBL may have a thickness of 20 nm to 40 nm.

In general, when the active layer 253B emits NUV light, the first and second conductive semiconductor layers 253C and 253A are formed of AlGaN having a low light-absorptiveness instead of GaN, in order to reduce absorption of light by the first and second conductive semiconductor layers 253C and 253A. However, since AlGaN has a low electrical conductivity, it increases an operating voltage.

However, the reflective layer 254 is disposed between the active layer 253B and the second conductive semiconductor layer 253A of the light emitting device 250, and thus, light emitted from the active layer 253B may be reflected from the reflective layer 254 before being absorbed by the second conductive semiconductor layer 253A. Thus, even though the second conductive semiconductor layer 253A is formed of p-type GaN instead of p-type AlGaN, the reflective layer 254 prevents the second conductive semiconductor layer 253A of GaN from absorbing light, and thus, optical properties may not deteriorate.

In addition, since the second conductive semiconductor layer 253A is formed of p-type GaN having a higher electrical conductivity than that of p-type AlGaN, an increase in operating voltage may be prevented, resulting in an improved electrical characteristic. Therefore, the light emitting device 250 of FIG. 7 may have a superior electrical characteristic to that of an existing light emitting device and optical characteristics thereof may not deteriorate.

In addition, each of the $Al_xG_{1-x}N$ superlattice layers 254B-1 and 254B-2 and the $Al_yG_{1-y}N$ superlattice layers 254A-1 and 254A-2 may have a thickness of 3 nm to 5 nm, and a total thickness of the reflective layer 254 may be 150 nm or less. Since the thickness of the reflective layer 254 is small, a second conductive carrier (i.e., holes) may be injected from the second conductive semiconductor layer 253A to the active layer 253B even though the reflective layer 254 is disposed between the active layer 253B and the second conductive semiconductor layer 253A. Moreover, when the reflective layer 254 is doped with a second conductive type (i.e., p-type) dopant, the second conductive carrier (i.e., holes) may be injected more into the active layer 253B, and thus, electrical characteristics of the light emitting device 250 may be improved.

In addition, the reflective layer 254, which acts as a reflector and an EBL, may improve crystallinity of the light emitting device 250, thereby reducing the occurrence of cracks.

With reference to FIG. 7, the intermediate layer 255 may be further disposed between the active layer 254B and the first conductive semiconductor layer 253C. The intermediate layer 255 may include a plurality of superlattice layers 255-1, 255-2, 255-3 and 255-4. The intermediate layer 255 relieves strain and may have a structure in which a pair structure of an AlN superlattice layer and an AlGaN superlattice layer is repeatedly stacked. In some embodiments, the light emitting device 250 may not include the intermediate layer 255.

The first electrode layer 256 may be disposed on the first conductive semiconductor layer 253C. The first electrode layer 256 may be formed of a metal. Also, the first electrode layer 256 may be formed of a reflective electrode material having an ohmic property. For example, the first electrode layer 256 may be formed as a single layer or multiple layers of at least one of Al, Ti, Cr, Ni, Cu, or Au.

Although not illustrated in FIG. 7, the first conductive semiconductor layer 253C may have a photonic crystal structure or roughness at an upper portion thereof to increase a light extraction efficiency.

FIGS. 9A through 9H are cross-sectional views illustrating a method for manufacturing the light emitting device 250 of FIG. 7, according to an embodiment.

Figure 9A:
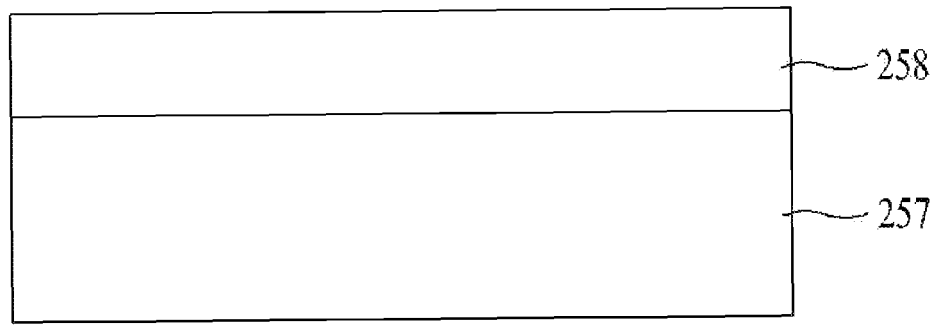

As illustrated in FIG. 9A, the substrate 257 is prepared. Here, the substrate 257 may be a conductive substrate or an insulating substrate. For example, the substrate 257 may be formed of at least one of sapphire ($Al_2O_3$), SiC, GaAs, GaN, ZnO, Si, GaP, InP, Ge, or $Ga_2O_3$.

Subsequently, the buffer layer 258 is grown on the substrate 257 in a non-polar direction at a temperature ranging from 1000□ to 1100□. According to an embodiment, the buffer layer 258 may be grown in a non-polar a-direction on the substrate 257 of an r-direction. According to another embodiment, the buffer layer 258 may be grown in a non-polar m-direction on the (1123) plane of the substrate 257. Here, the buffer layer 258 may have a thickness of 2 μm to 5 μm and an FWHM of 400 arcsec or less in an XRD rocking curve.

The buffer layer 258 is formed to relieve lattice mismatch and difference in coefficients of thermal expansion of a material. The buffer layer 258 may be formed of at least one of Group III-V compound semiconductors, for example, GaN, InN, AlN, InGaN, AlGaN, InAlGaN, or AlInN. An undoped semiconductor layer may be formed on the buffer layer 258, but embodiments are not limited thereto.

Figure 9B:
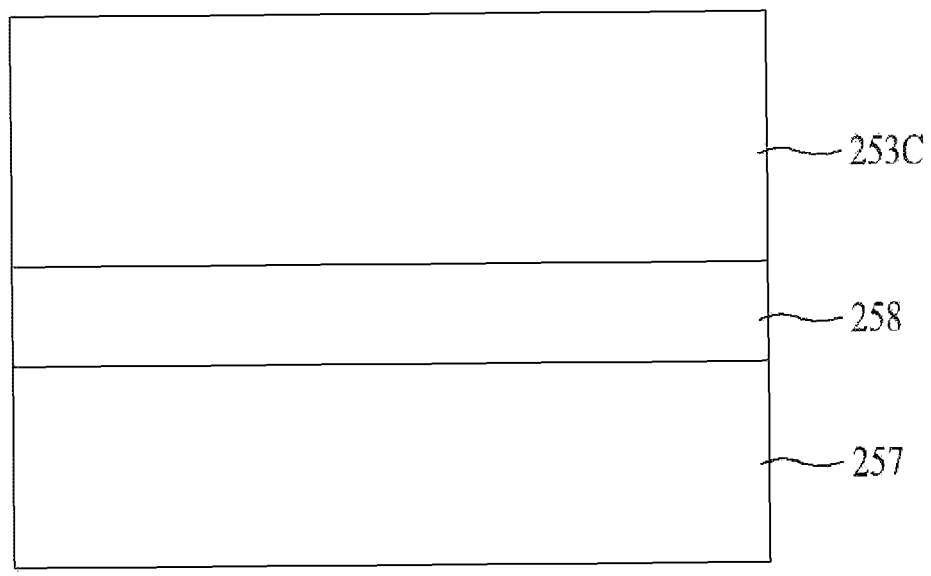

Next, as illustrated in FIG. 9B, the first conductive semiconductor layer 253C is formed on the buffer layer 258. The first conductive semiconductor layer 253C may be formed by, for example, metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), or the like, but embodiments are not limited thereto.

The composition of the first conductive semiconductor layer 253C is the same as described above. The first conductive semiconductor layer 253C may be formed through injection of trimethyl gallium gas (TMGa), ammonia gas ($NH_3$), nitrogen gas ($N_2$), or silane gas ($SiH_4$) containing an n-type impurity such as Si into a chamber.

Figure 9C:
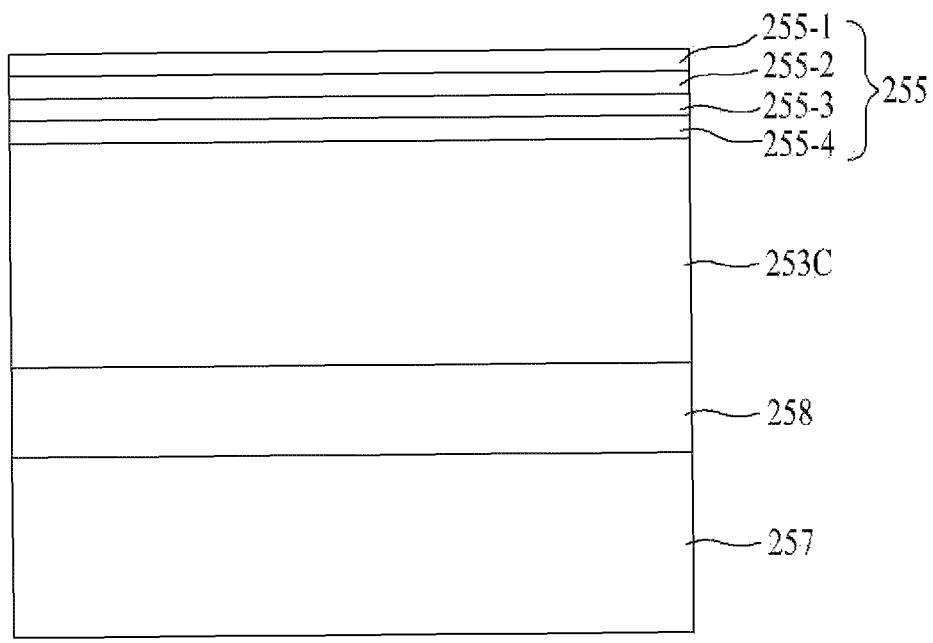

Next, referring to FIG. 9C, the intermediate layer 255 is formed on the first conductive semiconductor layer 253C. For example, the intermediate layer 255 may have a structure in which a pair structure of AlN superlattice layers 255-1 and 255-3 and AlGaN superlattice layers 255-2 and 255-4 is repeatedly stacked, but embodiments are not limited thereto.

Figure 9D:
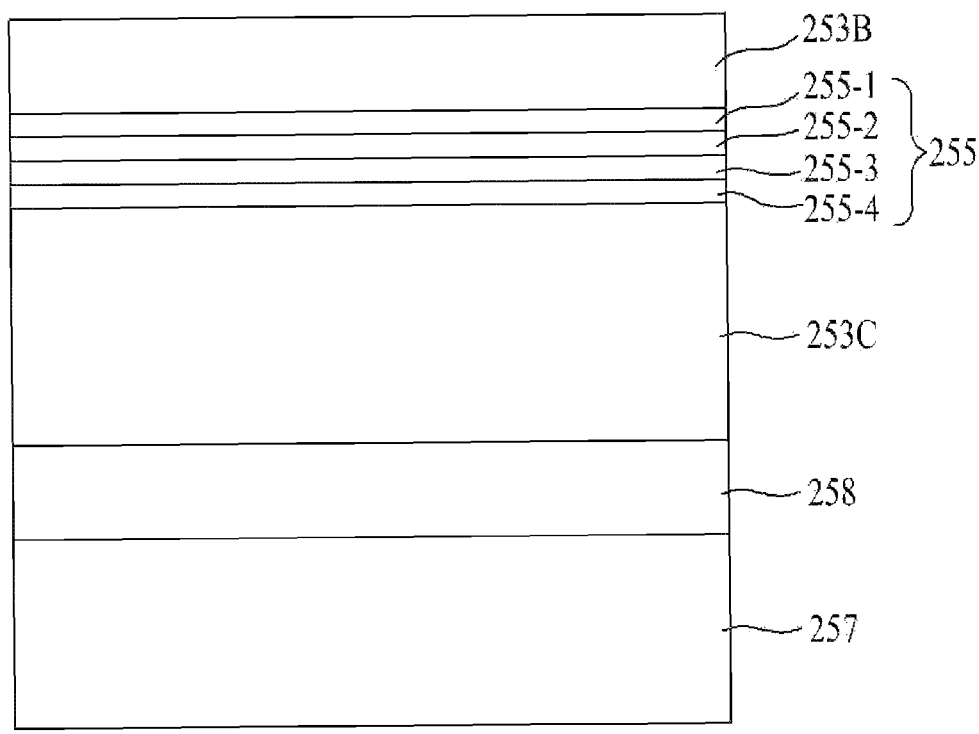

Next, referring to FIG. 9D, the active layer 253B is formed on the intermediate layer 255. The active layer 253B may have an MQW structure formed through injection of trimethyl gallium gas (TMGa), ammonia gas ($NH_3$), nitrogen gas($N_2$), and trimethyl indium gas(TMIn), but embodiments are not limited thereto.

Figure 9E:
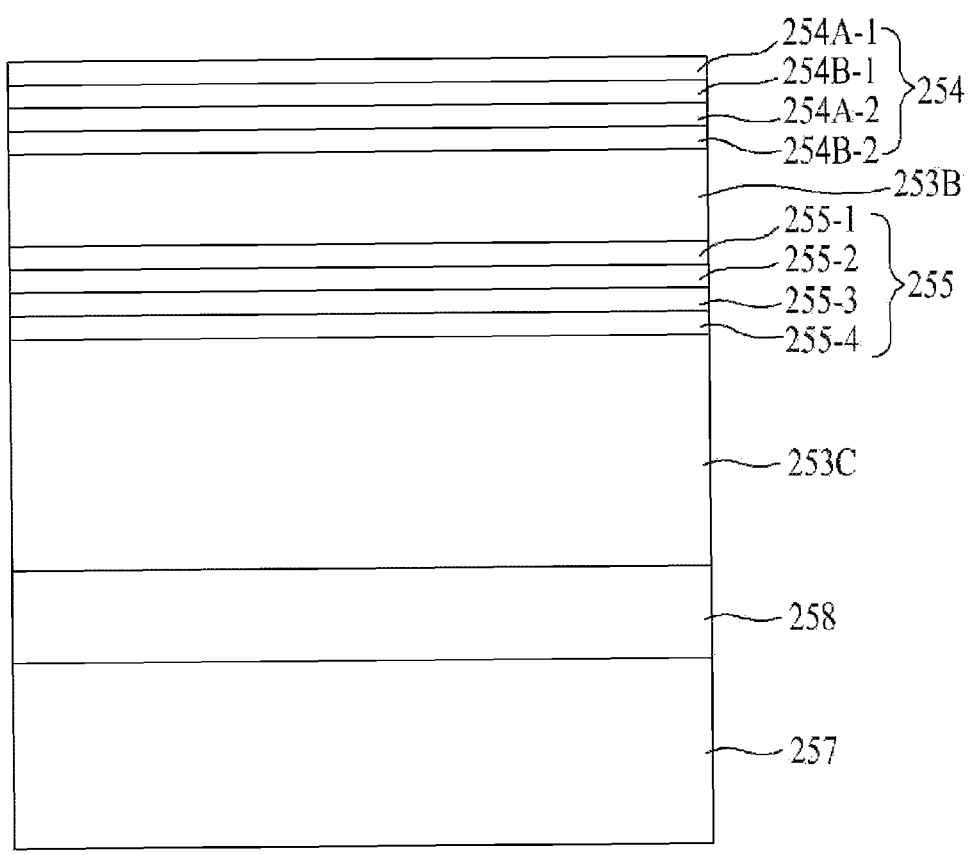

Next, referring to FIG. 9E, the reflective layer 254 is formed on the active layer 253B. For example, the reflective layer 254 may be formed using as a reaction source trimethyl gallium gas (TMGa), trimethoxyamphetamines (TMA), ammonia gas ($NH_3$), nitrogen gas($N_2$), trimethyl magnesium (TMMg), and trimethyl indium gas (TMIn) by MOCVD or metal-organic vapor-phase epitaxy (MOVPE) at a temperature of about 950□ to about 1000□, but embodiments are not limited thereto.

Figure 9F:
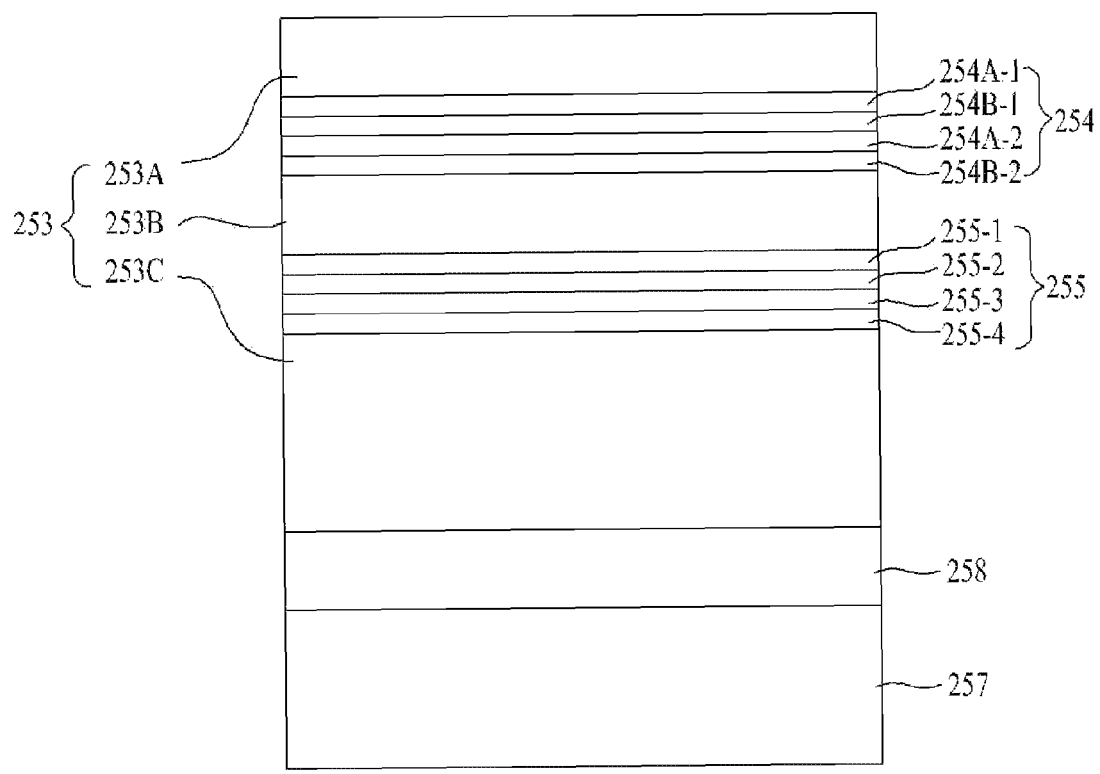

Next, referring to FIG. 9F, the second conductive semiconductor layer 253A is formed on the reflective layer 254. The composition of the second conductive semiconductor layer 253A is the same as described above. The second conductive semiconductor layer 253A may be formed as a p-type GaN layer through injection of trimethyl gallium gas (TMGa), ammonia gas ($NH_3$), nitrogen gas ($N_2$), and biscetyl cyclo pentadienyl magnesium ($EtCp_2Mg$){$Mg(C_2H_5C_5H_4)_2$} containing a p-type impurity such as magnesium (Mg) into a chamber, but the present disclosure is not limited thereto.

According to an embodiment, each of the first conductive semiconductor layer 253C, the active layer 253B, and the second conductive semiconductor layer 253A of the aforementioned light emitting structure 253 may be grown in a non-polar direction on the substrate 257. In an embodiment, the light emitting structure 253 may be grown in a non-polar a-direction on the substrate 257 of an r-direction. According to another embodiment, the light emitting structure 253 may be grown in a non-polar m-direction on the (1123) plane of the substrate 257.

Next, referring to FIG. 9G, the second electrode layer 252 may be formed on the light emitting structure 253, i.e., the second conductive semiconductor layer 253A. The second electrode layer 252 may be formed by sputtering or electron beam deposition. Then, the supporting substrate 251 may be formed on the second electrode layer 252. The supporting substrate 251 may be formed by electrochemical metal deposition or bonding using eutetic metal.

Next, as illustrated in FIG. 9H, the substrate 257 and the buffer layer 258 are separated from the light emitting structure 253. For separation of the substrate 257, a laser lift off (LLO) method using an excimer laser may be used or dry etching or wet etching may also be used.

For example, as for the laser lift off method, when excimer laser beams having a wavelength of a certain region is irradiated to the substrate 257 after being focused, a heat energy is concentrated on a boundary surface between the substrate 257 and the first conductive semiconductor layer 253C of the light emitting structure 253, and thus the boundary surface is separated into gallium and nitrogen molecules, followed by instantaneous separation of the substrate 257 at a portion where the laser beams proceed, together with separation of the buffer layer 258.

Next, the resulting structure obtained after removal of the substrate 257 and the buffer layer 258 is turned upside down, and the first electrode layer 256 is then formed on the first conductive semiconductor layer 253C, as illustrated in FIG. 7.

In a general light emitting device, a light emitting structure is grown in a polar direction c-direction (i.e., direction) on a substrate. As for the light emitting device grown into such a crystal structure, a built-in electric field is induced by piezoelectric and spontaneous polarization due to the characteristics of the crystal structure, and accordingly, a quantum-confined stark effect occurs by the induced electric field. The built-in electric field reduces recombination efficiency of carriers in an active layer by separating electrons and holes from each other and causes red-shift of wavelengths. Thus, a color reproduction range of a light emitting device package including the light emitting device may be changed or the light emitting device package may unstably display colors.

However, the light emitting devices 150 and 250 according to the embodiments are not epitaxially grown in a c-axis direction and are constructed by growing the buffer layers 153 and 258 and the light emitting structures 154 and 253 in a non-polar a-direction ([1100] and [1120]) on the substrates 152 and 257 of an r-direction (e.g., [1102], [1011], and [1122]). Alternatively, according to another embodiments, the light emitting devices 150 and 250 may be constructed by growing the buffer layers 153 and 258 and the light emitting structures 154 and 253 in a non-polar in-direction on the (1123) plane of the substrates 152 and 257.

Thus, the light emitting devices 150 and 250 have no light shift. Therefore, the light emitting devices 150 and 250 may have a color purity of 0.5 or more. As used herein, the term "color purity" refers to a parameter representing quality and whiteness of a light source. Namely, the light emitting devices 150 and 250 according to the embodiment have a constant color reproduction range and stably display colors.

In addition, when p-type dopant such as Mg doped on GaN has a high concentration of $10E19/cm^3$ to $10E21/cm^3$, a carrier (i.e., holes) after activation of p-GaN grown in an existing polar direction has a small concentration of $5 \times 10E17/cm^3$. Due to this problem, it is difficult to dope an existing UV light emitting device with p-type AlGaN, and thus, efficiency thereof is reduced. However, since the light emitting device packages 100, 100A, 100B and 200 according to the aforementioned embodiments include the light emitting structures 154 and 253 grown in a non-polar direction, the concentration of a carrier after activation is $7 \times 10E18/cm^3$, which is higher than existing level. Thus, p-type doping of the light emitting device packages 100, 100A, 100B and 200 is easy, resulting in an improved efficiency. When the concentration of carriers after activation is high, the thicknesses of the second conductive semiconductor layers 154C and 253A may be reduced.

As described above, by growing the light emitting structure in an a-direction on the substrate of an r-direction or growing the light emitting structure in an in-direction on the (1123) plane of the substrate, the light emitting device (or light emitting device package) may have a constant color reproduction range and stably display colors, heat generated from the light emitting device package may be effectively dissipated to the outside, and an p-type doping efficiency may be improved.

According to another embodiment, a display device, a pointing device, or an illumination system including the light emitting device package described above may be provided. For example, the illumination system may include lamps or street lamps. Hereinafter, a head lamp and a display device will be described as an embodiment of an illumination system including the above-described light emitting device package.

Figure 10:
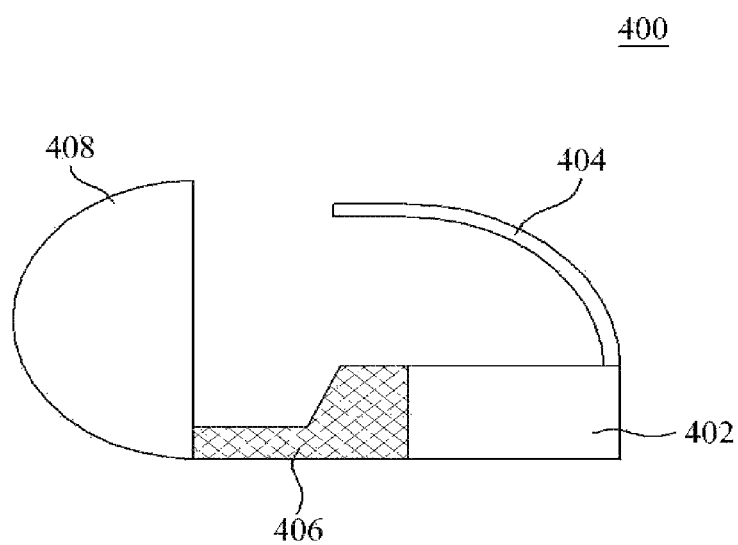
FIG. 10 is a diagram illustrating a head lamp including a light emitting device package according to an embodiment.

FIG. 10 is a diagram of a head lamp 400 including a light emitting device module 402, according to an embodiment. The light emitting device module 402 illustrated in FIG. 10 may include any one of the light emitting device packages 100, 100A, 100B and 200 illustrated in FIGS. 1, 2, 4, 5, and 6.

In the head lamp 400, light emitted from the light emitting device module 402 including the above-described light emitting device package may be reflected from a reflector 404 and a shade 406, transmit a lens 408, and be directed towards a front side of a car.

As described above, the light emitting device used in the light emitting device module 402 may have an improved light extraction efficiency, and thus, the entire optical characteristics of the head lamp 400 may be improved.

The light emitting device package included in the light emitting device module 402 may include a plurality of light emitting devices 150 or 250 mounted therein, but embodiments are not limited thereto.

Figure 11:
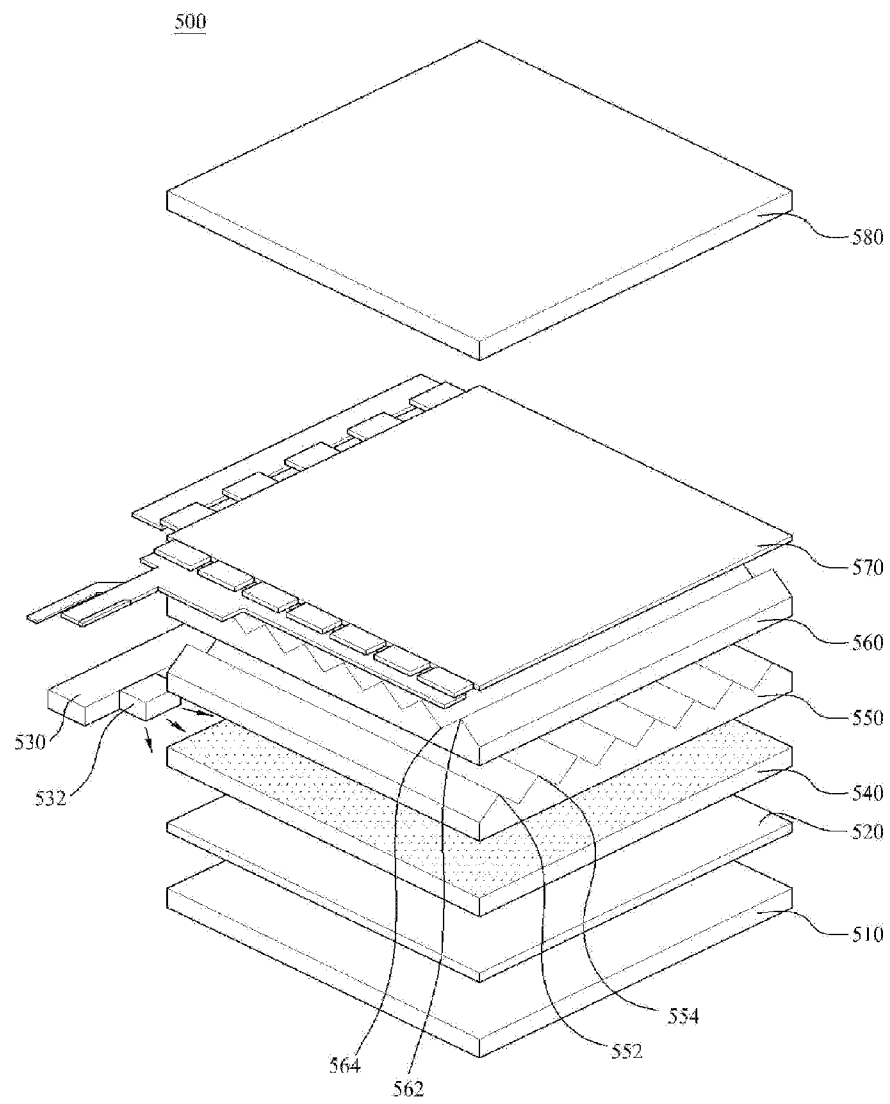
FIG. 11 is a diagram illustrating a display device including a light emitting device package according to another embodiment.

FIG. 11 is a diagram illustrating a display device 500 including a light emitting device package 532, according to another embodiment.

As illustrated in FIG. 11, the display device 500 includes a light source module, a reflective plate 520 on a bottom cover 510, a light guide plate 540 disposed at a front side of the reflective plate 520 and guiding light emitted from the light source module to a front side of the display device 500, a first prism sheet 550 and a second prism sheet 560 that are disposed at a front side of the light guide plate 540, a panel 570 at a front side of the second prism sheet 560, and a color filter 580 at a front side of the panel 570.

The light source module includes the light emitting device package 532 disposed on a circuit substrate 530. The circuit substrate 530 may be a printed circuit board (PCB) or the like. The light emitting device package 532 may correspond to the light emitting device packages 100, 100A, 100B and 200 of FIGS. 1, 2, 4, 5 and 6.

The bottom cover 510 may accommodate elements of the display device 500. The reflective plate 520 may be formed as an independent element as illustrated in FIG. 11 or a coating formed by coating of a highly reflective material on a rear surface of the light guide plate 540 or a front surface of the bottom cover 510 may act as the reflective plate 520.

The reflective plate 520 may be formed of a material that has a high reflectance and can be used in an ultrathin form, for example, polyethylene terephtalate (PET).

The light guide plate 540 scatters light emitted from the light emitting device package 532 and thus enables the emitted light to be uniformly dispersed over the entire region of a screen of a liquid crystal display device. Thus, the light guide plate 540 is formed of a material having a high refractive index and transmittance. For example, the light guide plate 540 may be formed of polymethylmethacrylate (PMMA), polycarbonate (PC), polyethylene (PE), or the like. In addition, when the light guide plate 540 is not formed, an air-guide type display device may be constructed.

The first prism sheet 550 may be formed on a surface of a supporting film and formed of a polymer material with optical transmission and elasticity. The first prism sheet 550 may include a prism layer in which a plurality of stereochemical structures is repeatedly formed. Here, a plurality of patterns may be configured such that floors 552 and valleys 554 are repeatedly formed in a stripe form as illustrated in FIG. 11.

In the second prism sheet 560, floors 562 and valleys 564 at a surface of a supporting film may extend in a direction perpendicular to the direction in which the floors 552 and the valleys 554 at the surface of the supporting film of the first prism sheet 550 extend. Such a disposition is intended for uniformly dispersing light transmitted from the light source module and the reflective plate towards all the direction of the panel 570.

In the present embodiment, the first and second prism sheets 550 and 560 constitute an optical sheet. Also, the optical sheet may be configured as a micro lens array, a combination of a diffusion sheet and a micro lens array, or a combination of a single prism sheet and a micro lens array.

A liquid crystal display panel may be used as the panel 570, but embodiments are not limited thereto. Also, other kinds of display devices that need a light source may be used as the panel 570.

The panel 570 is configured such that liquid crystal is arranged between glass bodies and a polarization plate is mounted on the glass body in order to use a polarization property of light. Here, liquid crystals, which have physical properties between liquids and solids, have a structure in which liquid crystal molecules with fluidity as liquid are aligned regularly as crystals. In this regard, an image is displayed using a property in which molecular arrangement of the liquid crystal molecules are changed by an external electric filed.

The liquid crystal display panel used in the display device may be of an active matrix type, and uses a transistor as a switch for adjusting a voltage applied to each pixel.

The color filter 580 is disposed on a front surface of the panel 570, and thus, transmits only red, green and blue light by each pixel of the light transmitted from the panel 570, thereby displaying an image.

In the display device 500 according the present embodiment, light extraction efficiency of the light emitting device 150 or 250 included in the light emitting device package 532 may be improved, and thus, optical characteristics of the display device 500 may be improved.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
a body having a cavity;
at least one insulating layer disposed on the body;
first and second electrode layers disposed on the insulating layer and electrically isolated from each other;
at least one light emitting device disposed on a bottom surface of the cavity and electrically connected to the first and second electrode layers;
a light-transmissive resin layer sealing the light emitting device disposed in the cavity;
a metal layer disposed on a rear surface of the body to face the light emitting device; and
third and fourth diffusion layers respectively disposed in top and bottom portions of the body that are not covered by the insulating layer and the first and second electrode layers and exposed,
wherein the light emitting device is grown in a non-polar direction on a substrate and comprises a light emitting structure comprising a first conductive semiconductor layer, and active layer, and a second conductive semiconductor layer, and
wherein the third diffusion layer is disposed to be separate from the light emitting device.

2. The light emitting device package according to claim 1, wherein the light emitting structure is grown in a non-polar a-direction on the substrate of an r-direction.

3. The light emitting device package according to claim 1, wherein the light emitting structure is grown in a non-polar m-direction on a (1123) plane of the substrate.

4. The light emitting device package according to claim 1, wherein the metal layer has a larger width than that of the light emitting device.

5. The light emitting device package according to claim 1, wherein light emitted from the light emitting device has a color purity of at least 0.5.

6. The light emitting device package according to claim 1, wherein the light-transmissive resin layer comprises at least one of a plurality of phosphors.

7. The light emitting device package according to claim 6, wherein the phosphors comprise a first phosphor having a light emitting wavelength of 480 nm to 500 nm and a second phosphor having a light emitting wavelength of 580 nm to 620 nm.

8. The light emitting device package according to claim 1, wherein the light emitting device emits light having a near-ultraviolet light wavelength.

9. The light emitting device package according to claim 1, wherein the light emitting device further comprises a buffer layer grown in the non-polar direction between the substrate and the first conductive semiconductor layer.

10. The light emitting device package according to claim 1, wherein the light-transmissive resin layer comprises a first light-transmissive resin layer having a flat upper surface.

11. The light emitting device package according to claim 10, wherein the light-transmissive resin layer further comprises a second light-transmissive resin layer disposed on the first light-transmissive resin layer and having a dome-shaped upper portion.

12. The light emitting device package according to claim 1, further comprising first and second diffusion layers disposed in the body, electrically connected respectively to the first and second electrode layers, and comprising impurities injected thereto.

13. The light emitting device package according to claim 1, wherein the third and fourth diffusion layers are electrically isolated from the first and second electrode layers.

14. The light emitting device package according to claim 1, wherein the light emitting device further comprises a reflective layer disposed between the second conductive semiconductor layer and the active layer and comprising at least one double-layered structure including an $Al_xGa_{1-x}N$ superlattice layer and an $Al_yGa_{1-y}N$ superlattice layer, and
wherein x and y are different from each other, and thus, the $Al_xGa_{1-x}N$ superlattice layer and the $Al_yGa_{1-y}N$ superlatticen layer have different refractive indexes.

15. The light emitting device package according to claim 14, wherein the active layer comprises at least one pair structure of a well layer and a barrier layer, and the reflective layer has a higher energy band gap than that of the barrier layer.

16. The light emitting device package according to claim 15, wherein y is greater than x.

17. The light emitting device package according to claim 15, wherein $0.2 \leq x \leq 0.3$ and $0.3 \leq y \leq 1$.

18. The light emitting device package according to claim 15, wherein the reflective layer is doped with a second conductive dopant.

19. The light emitting device package according to claim 15, wherein the second conductive semiconductor layer comprises a material having a higher electrical conductivity than that of AlGaN.

* * * * *